(12) United States Patent
Valavala et al.

(10) Patent No.: US 11,664,293 B2
(45) Date of Patent: May 30, 2023

(54) SOLID STATE THERMOELECTRIC COOLER IN SILICON BACKEND LAYERS FOR FAST COOLING IN TURBO SCENARIOS

(71) Applicant: Intel Corporation, Santa Clara, CA (US)

(72) Inventors: Krishna Vasanth Valavala, Chandler, AZ (US); Ravindranath V. Mahajan, Chandler, AZ (US); Chandra Mohan Jha, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 16/665,621

(22) Filed: Oct. 28, 2019

(65) Prior Publication Data

US 2021/0125897 A1   Apr. 29, 2021

(51) Int. Cl.

| | |
|---|---|
| *H01L 23/38* | (2006.01) |
| *H01L 23/42* | (2006.01) |
| *H01L 23/367* | (2006.01) |
| *H01L 23/10* | (2006.01) |
| *H01L 21/48* | (2006.01) |
| *H01L 25/065* | (2023.01) |
| *H01L 23/00* | (2006.01) |

(52) U.S. Cl.
CPC .......... *H01L 23/38* (2013.01); *H01L 21/4871* (2013.01); *H01L 23/10* (2013.01); *H01L 23/367* (2013.01); *H01L 23/42* (2013.01); *H01L 24/16* (2013.01); *H01L 25/0655* (2013.01); *H01L 25/0657* (2013.01); *H01L 2224/16225* (2013.01)

(58) Field of Classification Search
CPC ........ H01L 23/367; H01L 23/38; H01L 23/42
See application file for complete search history.

(56) References Cited

U.S. PATENT DOCUMENTS

2007/0056621 A1\* 3/2007 Baskaran ................ H01L 35/16
136/203

\* cited by examiner

*Primary Examiner* — Walter H Swanson
(74) *Attorney, Agent, or Firm* — Schwabe, Williamson & Wyatt, P.C.

(57) ABSTRACT

Embodiments include a semiconductor package with a thermoelectric cooler (TEC), a method to form such semiconductor package, and a semiconductor packaged system. The semiconductor package includes a die with a plurality of backend layers on a package substrate. The backend layers couple the die to the package substrate. The semiconductor package includes the TEC in the backend layers of the die. The TEC includes a plurality of N-type layers, a plurality of P-type layers, and first and second conductive layers. The first conductive layer is directly coupled to outer regions of bottom surfaces of the N-type and P-type layers, and the second conductive layer is directly coupled to inner regions of top surfaces of the N-type and P-type layers. The first conductive layer has a width greater than a width of the second conductive layer. The N-type and P-type layers are directly disposed between the first and second conductive layers.

16 Claims, 6 Drawing Sheets

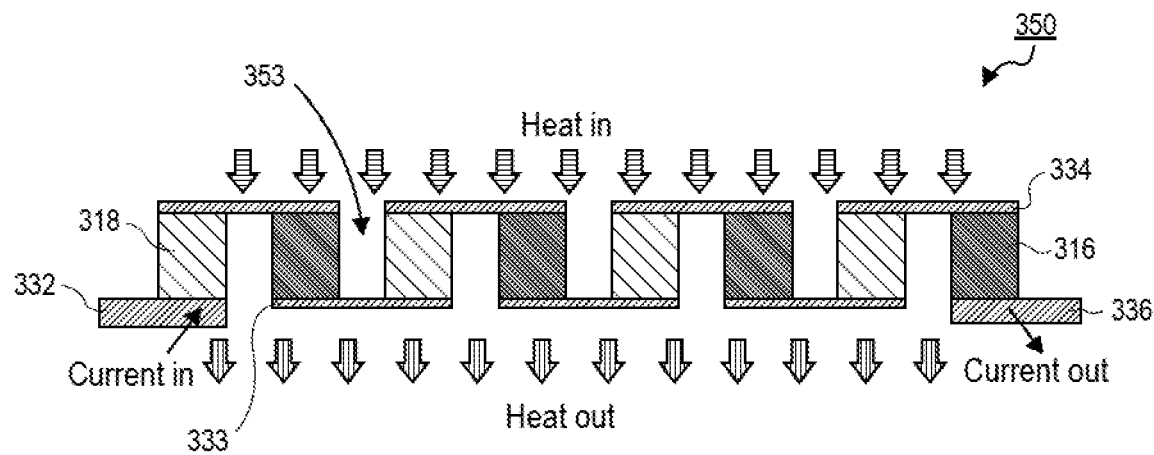
FIG. 3A
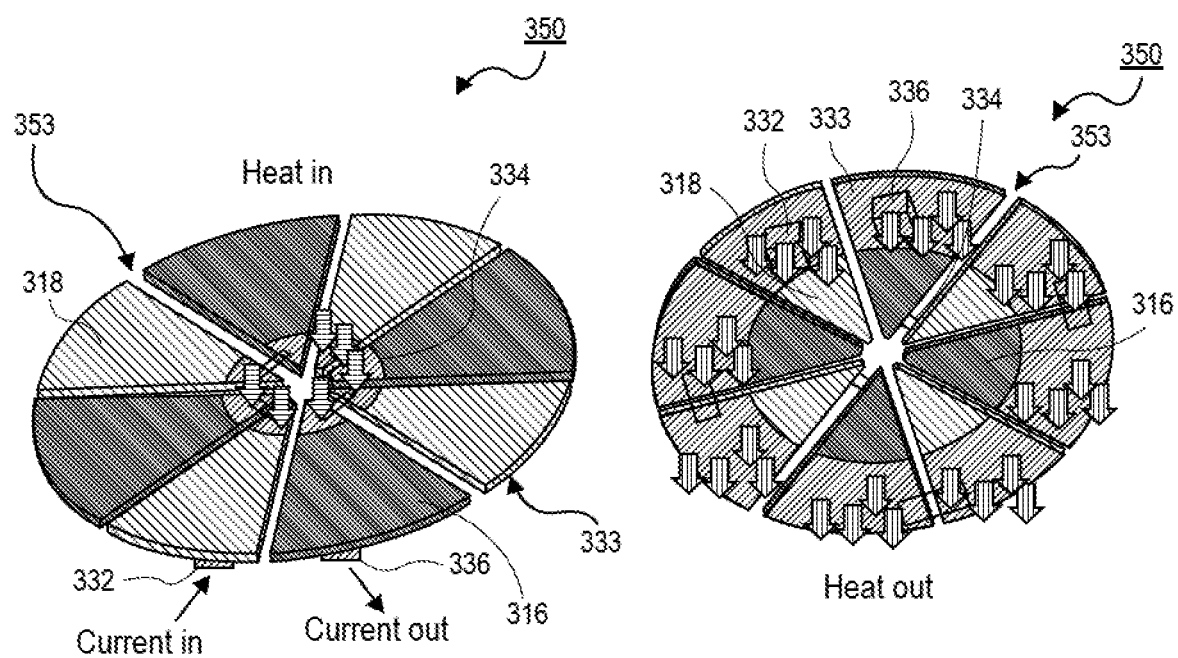
FIG. 3B          FIG. 3C

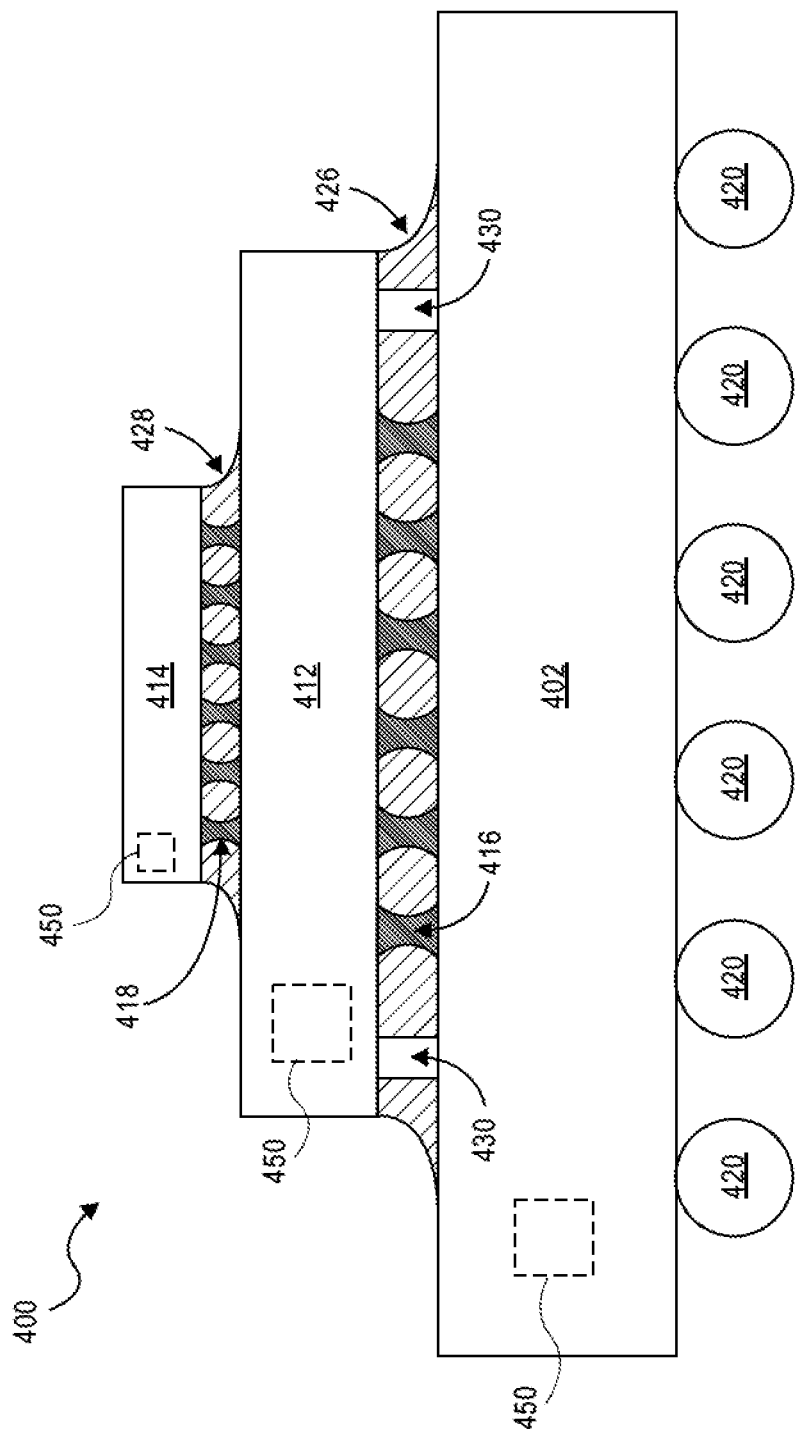

SOLID STATE THERMOELECTRIC COOLER IN SILICON BACKEND LAYERS FOR FAST COOLING IN TURBO SCENARIOS

FIELD

Embodiments relate to packaging semiconductor devices. More particularly, the embodiments relate to semiconductor devices with solid state thermoelectric coolers in silicon backend layers for fast cooling in turbo scenarios.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as central processing units (CPUs), while optimizing the performance of each device, however is not without issue.

CPUs can include turbo power scenarios characterized as short bursts of high CPU power. Turbo power scenarios are typically required to accelerate desired workloads and speed up the booting-up process of the CPUs. For example, the CPU dies generally desire such turbo power scenarios to increase the burst durations and thus extract higher performances. The slow response time of typical cooling solutions, however, limit this burst duration.

Cooling solutions are typically separated from silicon dies (e.g., CPU dies) by one or two layers of thermal interface materials, integrated heat spreaders, and heat sink components. This distance between the silicon dies and the ultimate heat sink components substantially limits the response time of the cooling solutions.

BRIEF DESCRIPTION OF THE DRAWINGS

Embodiments described herein are illustrated by way of example and not limitations in the figures of the accompanying drawings, in which like references indicate similar features. Furthermore, some conventional details have been omitted so as not to obscure from the inventive concepts described herein.

FIGS. 3A-3C are illustrations of cross-sectional and perspective views of a TEC with a plurality of P-type layers, a plurality of N-type layers, and a plurality of conductive traces, according to some embodiments.

FIG. 4 is an illustration of a cross-sectional view of a semiconductor packaged system including a die, a substrate, a package substrate, and one or more TECs, according to one embodiment.

DETAILED DESCRIPTION

Figure 1:
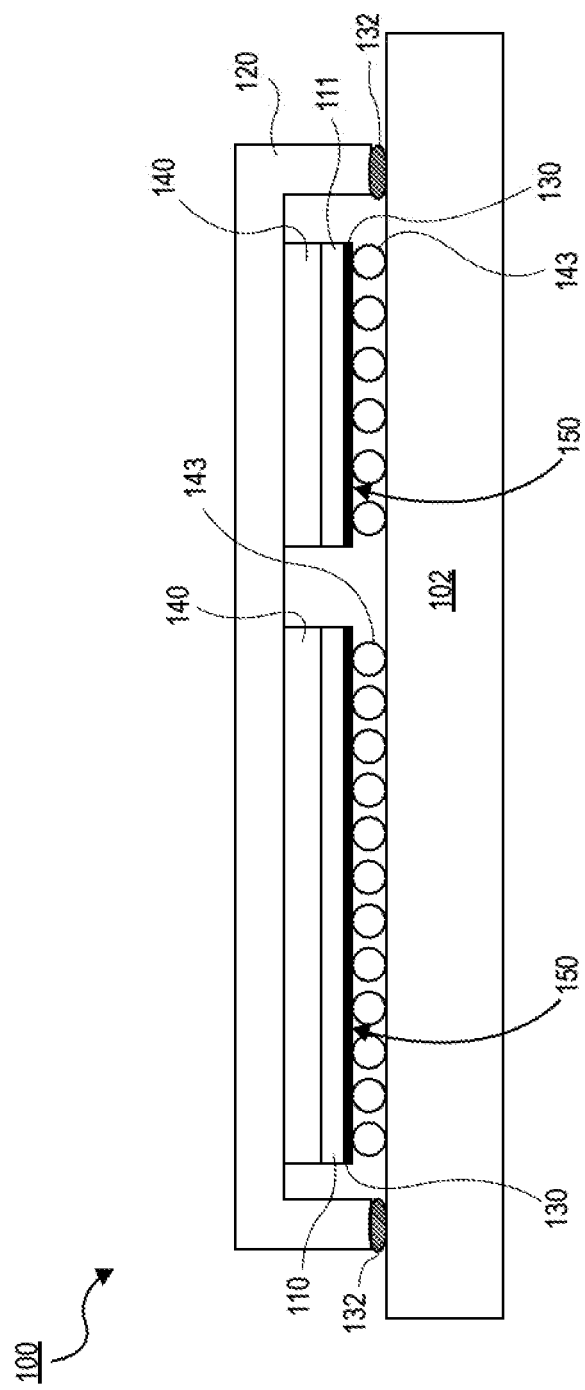
FIG. 1 is an illustration of a cross-sectional view of a semiconductor package with an integrated heat spreader (IHS), a thermal interface material (TIM), a plurality of dies with a plurality of thermoelectric coolers (TECs) and a plurality of backend layers, and a package substrate, according to one embodiment.

Described herein are semiconductor packages with solid state thermoelectric coolers (TECs) and methods of forming such semiconductor packages with the solid state TECs. The semiconductor packages described below and methods of forming such semiconductor packages may include an integrated heat spreader (IHS), a thermal interface material (TIM), one or more dies (or active dies), and a package substrate, according to one embodiment. In particular, these embodiments may include the TEC disposed in a backend layer (or a plurality of backend layers) of the active die. For example, the TEC may have one or more thermoelectric cooling components, such as a plurality of N-type layers, a plurality of P-type layers, and a plurality of conductive traces and vias, that are combined into a desired arrangement (or pattern/shape) and disposed within the backend layer of the active die for fast cooling during one or more turbo scenarios (or power modes), according to some embodiments.

The embodiments described herein may include the solid state TEC implemented (and/or positioned) substantially close to the heat generation of the active die to quickly respond and enable larger power spikes, longer durations of bursts, and so on. In these embodiments, the semiconductor package may implement the thin film TEC in the backend layer of the active die, and the close proximity of this thin film TEC to the active die enables a cooling solution that is desirable for immediate cooling, delayed Joule heating penalty, and longer and larger power bursts.

The embodiments described herein provide improvements to existing packaging solutions by providing substantially immediate cooling solutions to customers (or the like) in gaming and other mobile/desktop segments that often rely on turbo scenarios for various applications of their workloads. Additionally, the TECs described herein enable the semiconductor packages to achieve higher performances, improve thermal solutions, and reduce reaction times to turbo based on cooling proximity to the hot spots of the active die. For example, the TECs may be implemented within the backend layers of the active die to spread the heat from a small region to a larger region that is substantially close to the hot spot. Additionally, in these embodiments, the TECs described herein may be implemented to avoid the usual path of heat conduction as the low-k of the TECs do not impact the usual heat conduction path.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with IHSs, TIMs, dies with backend layers and TECs, and package substrates.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In some embodiments, the semiconductor package 100 with an IHS 120, a TIM 140, a plurality of dies 110-111 (or one or more dies) with a plurality of TECs 150 and a plurality of backend layers 130, and a package substrate 102, according to one embodiment. For one embodiment, the dies 110-111 may be disposed on the package substrate 102, where the dies 110-111 may be a first die 110 and a second die 111 coupled to the package substrate 102 with a plurality of solder balls 143. Note that, in another embodiment, the semiconductor package 100 may include a single die such as the first die 110 or the second die 111. In an embodiment, the TIM 140 may be disposed on the dies 110-111. Furthermore, the IHS 120 may be disposed over the TIM 140, the dies 110-111, and the package substrate 102, where the IHS 120 may be coupled to the package substrate with a sealant 132 (or the like), and where the IHS 120 may surround the dies 110-111, the TIM 140, and the solder balls 143.

As shown in FIG. 1, the dies 110-111 may include the backend layers 130 and the TECs 150, where the backend layers 130 may be comprised of dielectric layers (or insulating layers) and conductive layers/interconnects (e.g., conductive/metallic traces, vias, pads/contacts, and so on). Note that, as described herein, the backend layers 130 may refer to one or more layers comprised of backend materials such as insulating layers, conductive layers, and so on. For example, the dies 110-111 may be active dies with the backend layers 130 used to couple and transmit signals between the dies 110-111 and the package substrate 102. In these embodiments, the backend layers 130 may include dielectric layers and conductive routing layers (e.g., copper traces/lines, pads, vias, planes, etc.). Additionally, for some embodiments, the TECs 150 may be disposed in the backend layers 130 of the dies 110-111. For example, the TECs 150 may be implemented with one or more thermoelectric materials that are disposed/embedded within the backend layers 130. In some embodiments, the TECs 150 may include a plurality of N-type layers, a plurality of P-type layers, and a plurality of conductive traces and vias that are implemented into a desired arrangement (e.g., as shown with the arrangement of the TEC 300 illustrated in FIGS. 3A-3C).

In an embodiment, the TECs 150 may be implemented with one or more processes such as by disposing (or depositing) one or more thin conductive/metallization layers, then selectively etching the thin conductive/metallization layers, and so on. For some embodiments, the TECs 150 may be disposed and positioned (or located) in the middle of the backend layers 130 or on the top surface of the backend layers 130, where the position of the TECs 150 may be based on the hot spot regions of the dies 110-111. For example, the TECs 150 may be directly positioned below/under the hot spot regions of the dies 110-111, and/or the TECs 150 may be directly positioned substantially close to the hot spot regions of the dies 110-111. Additionally, the semiconductor package 100 may implement these TECs 150 to direct (or force) the heat spreading of the dies 110-111 in the X-Y plane, and may be powered on or off using the solder balls 143 as the first-level interconnects (FLI) bumps of the dies 110-111.

As described herein, the semiconductor package 100 is merely one example of an embodiment of a semiconductor packaged system. For one embodiment, the semiconductor package 100 may include a ball grid array (BGA) package, a land grid array (LGA) package, and/or a pin grid array (PGA) package. Additionally, note that the semiconductor package 100 is not limited to the illustrated semiconductor packaged system, and thus may be designed/formed with fewer, alternate, or additional packaging components and/or with different interconnecting structures. For example, while one IHS 120, one TIM 140, two dies 110-111, and two TECs 150 are illustrated, it is to be appreciated that any number of IHSs 120, TIMs 140, dies 110-111, and TECs 150 may be implemented with the package substrate 102 of the semiconductor package 100.

For one embodiment, the package substrate 102 may be coupled to the dies 110-111 via the solder balls 143 (or the FLI bumps), where the solder balls 143 may be implemented as solder bumps/joints formed from respective microbumps. A solder ball (or joint) formed by soldering of a microbump according to an embodiment may itself be referred to as a "bump" and/or a "microbump." Additionally, for other embodiments, the package substrate 102 may be coupled to one or more of the dies 110-111 using an anisotropic conductive film (ACF) or the like. The package substrate 102 may include a variety of electronic structures formed thereon or therein. In certain embodiments, the package substrate 102 may be an organic substrate made up of one or more layers of polymer base materials, with conducting regions for transmitting signals.

For some embodiments, the package substrate 102 may include, but is not limited to, a package, a substrate, a printed circuit board (PCB), and a motherboard. For example, the package substrate 102 may be a PCB. For one embodiment, the PCB may include an FR-4 glass epoxy base with thin copper foil laminated on both sides. For certain embodiments, a multilayer PCB may be used, with pre-preg and copper foil used to make additional layers. For example, the multilayer PCB may comprise alternating layers of organic build-up layers and conductive (e.g., copper) routing layers, as are known in the art. The package substrate 102 may include one or more dielectric layers, where the dielectric layers may be a photosensitive dielectric layer. The package substrate 102 may include one or more conductive layers, which may further include conductive traces, lines, pads, vias, holes, and/or planes. Additionally, although some embodiments are not limited in this regard, the package substrate 102 may in turn be coupled to another body (or substrate) such as a motherboard or the like.

In some embodiments, the dies 110-111 may be disposed on and coupled to the top surface of the package substrate 102 with the solder balls 143. As shown in FIG. 1, the semiconductor package 100 may implement the first die 110 to be disposed adjacent to the second die 111. While, in other embodiments, the semiconductor package 100 may include a stack of dies as such one or more dies may be stacked on/above the first die 110 and/or the second die 111. In an embodiment, the dies 110-111 may include, but are not limited to, a semiconductor active die, a stack of semiconductor dies, an electronic device (e.g., a wireless device), an integrated circuit (IC), a central processing unit (CPU), a graphic processing unit (GPU), a microprocessor, a platform controller hub (PCH), a memory (e.g., a high-bandwidth memory (HBM)), and/or a field-programmable gate array (FPGA).

The dies 110-111 may be formed from a material such as silicon and have circuitry thereon, such as the silicon backend layers 130 and the TECs 150, which is to be coupled to the package substrate 102. In some embodiments, the backend layers 130 of the dies 110-111 may include a plurality of conductive interconnects and a plurality of dielectric layers (or the like). For example, the backend layers 130 may include a plurality of redistribution layers (RDLs) comprised of conductive traces with line/spacing (L/S) of approximately 2/2 um or less, lithographically-defined vias, zero-misalignment vias, and/or via pads with thicknesses of approximately 18 um or less. In one embodiment, the backend layers 130 may be silicon backend layers that are implemented (or disposed/formed) on the backside of the dies 110-111.

In some embodiment, the first die 110 may have a width and/or a thickness that is substantially equal to a width and/or a thickness of the second die 111. In other embodiments, the first die 110 may have a width and/or a thickness that is different than a width and/or a thickness of the second die 111. For one embodiment, the first die 110 may have a top surface that is substantially coplanar to a top surface of the second die 111.

One or more connections between the package substrate 102, the dies 110-111, and the TIM 140—e.g., including some or all of the solder bumps 143—may include one or more interconnect structures, encapsulation layers, underfill layers, and so on. In some embodiments, the interconnect structures may variously comprise an alloy of nickel, palladium, and tin (and, in some embodiments, copper, silver, or the like). For one embodiment, the encapsulation layer may include one or more mold materials disposed over and around the respective components. In an embodiment, the underfill layer may be one or more polymer materials injected between the respective components. In an alternative embodiment, the underfill layer may be a molded underfill (MUF) material.

Furthermore, as shown in FIG. 1, the TIM 140 may be directly coupled onto the top surfaces of the dies 110-111 and the bottom surface of the IHS 120. In one embodiment, the TIM 140 may be a solder TIM (STIM) such as an indium STIM or the like. In other embodiments, the TIM 140 may include one or more highly thermal conductivity materials. For example, the TIM 140 may be a metallic TIM, a STIM, a polymer TIM (PTIM), and/or any similar highly thermal conductive material(s). In some embodiments, the thickness of the region of the TIM 140 disposed over the first die 110 may be substantially equal to or different from the thickness of the region of the TIM 140 disposed over the second die 111.

In one embodiment, the IHS 120 may be disposed over the TIM 140, the dies 110-111, and the package substrate 102. For one embodiment, the IHS 120 may be manufactured (or shaped) to include a lid and a plurality of legs (or sidewalls, pedestals, etc.). For example, the lid of the IHS 120 may be directly disposed on the top surface of the TIM 140, and the legs of the IHS 120 may be disposed on the package substrate 102, where the legs of the IHS 120 may be coupled to the package substrate 102 with the sealant 132. In some embodiments, the IHS 120 may be a heat sink, a heat spreader, a heat exchanger, a manifold, a cold plate, and/or any similar thermal solution (or device) that may be used to help transfer the heat from the electrical components of the semiconductor package 100 to the ambient environment (or an additional heat spreader). Also, in one embodiment, the sealant 132 may be comprised of one or more adhesive materials such as epoxies, resins, silicon, and/or any known adhesive materials.

Note that the semiconductor package 100 may include fewer or additional packaging components based on the desired packaging design.

Figure 2:
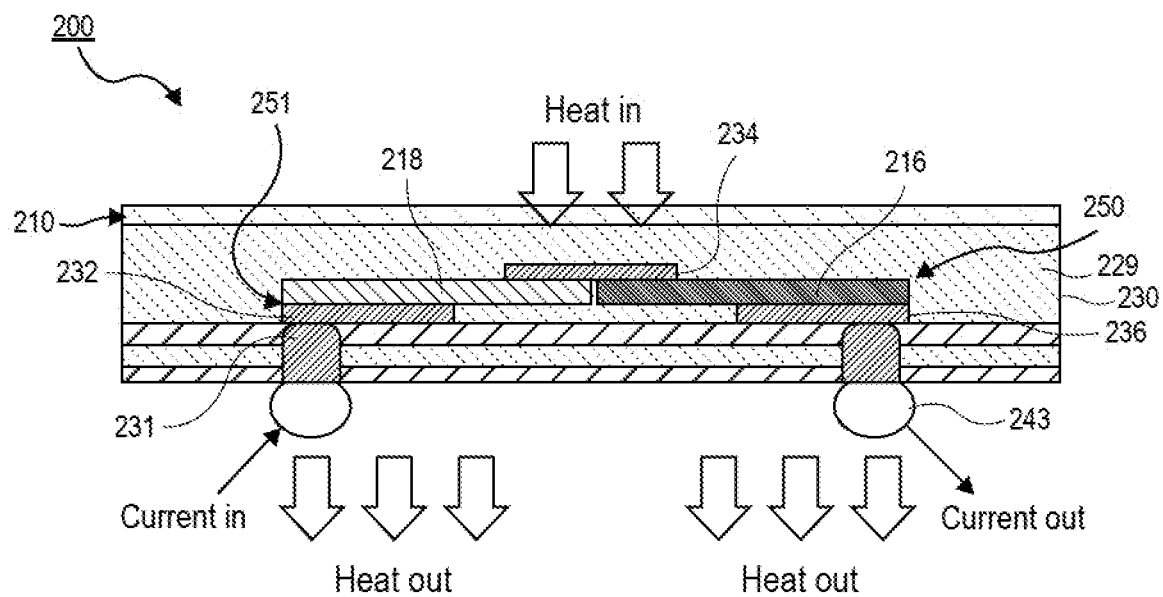
FIG. 2 is an illustration of a cross-sectional view of a portion of a semiconductor package with an active die, where the active die has a TEC disposed in a plurality of backend layers, according to one embodiment.

Referring now to FIG. 2, a cross-sectional illustration of a portion of a semiconductor package 200 is shown, in accordance with an embodiment. In some embodiments, the semiconductor package 200 may include a die 210 with a TEC 250 and a plurality of backend layers 230. The semiconductor package 200 may be substantially similar to the semiconductor package 100 described above in FIG. 1. Likewise, the components of the semiconductor package 200 are substantially similar to the components of the semiconductor package 100 described above in FIG. 1. Accordingly, the die 210 with the TEC 250, the backend layers 230, and the solder balls 243 may be substantially similar to the die 110 with the TEC 150, the backend layers 130, and the solder balls 143 described above in FIG. 1.

As shown in FIG. 2, the semiconductor package 200 may implement the die 210 with the backend layers 230, and the backend layers 230 with one or more dielectric layers 229, where the dielectric layers 229 may be comprised of any dielectric (or insulating) material known in the art. The dielectric layers 229 of the backend layers 230 may surround (or embed) the TEC 250. Also, in some embodiments, a plurality of solder balls 243 may be implemented as the FLI ball/bumps on the bottom surface of the backend layers 230 of the die 210. Additionally, as shown in FIG. 2, the semiconductor package 200 may have a heat path that directs "Heat in" through the die 210 to the backend layers 230 and the TEC 250, and "Heat out" from the backend layers 230 and the TEC 250 to the solder balls 243, where the solder balls 243 may be used for current to be directed in/out through the TEC 250 as shown with the "Current in" and "Current out." For some embodiments, the TEC 250 may be disposed within the backend layers 230 of the die 210, where the TEC 250 may be implemented with an arrangement comprised of a plurality of N-type layers 216, a plurality of P-type layers 218, a plurality of conductive traces 232, 234, and 236, and a plurality of vias 231.

In some embodiments, the TEC 250 may include one or more TEC cooling elements comprised of the conductive traces 232, 234, and 236, the vias 231, and the N-type and P-type thermoelectric materials of the N-type and P-type layers 216 and 218. For some embodiments, the TEC cooling components/elements of the TEC 250 may be deposited/etched during the fabrication process of the backend layers 230 using thin film complementary metal-oxide-semiconductor (CMOS) fabrication techniques or the like. Furthermore, in some embodiments, the N-type and P-type layers 216 and 218 (or the thermoelectric layers), the conductive traces 232, 234, and 236, and the vias 231 may be connected to create any desired thermal pathway based on the arrangement of the TEC 250 (e.g., as shown with the arrangement of the TEC 350 of FIGS. 3A-3C). For example, the arrangement of the TEC 250 may be implemented by patterning and etching the thermoelectric materials into the alternating patches (or pillars) of the N-type and P-type layers 216 and 218 that are coupled via the conductive traces 232, 234, and 236. Additionally, in some embodiments, the solder bumps 243 coupled to the backend layers 230 of the die 210 may be used as the electrical connections that may provide the current for the operation of the TEC 250.

As shown in FIG. 2, in some embodiments, the vias 231 may couple the solder balls 243 to the conductive traces 232 and 236, where the conductive traces 232 and 236 may be implemented as a first conductive layer disposed on and coupled to the bottom surfaces of the N-type and P-type layers 216 and 218. In these embodiments, the conductive traces 232 and 236 of the first conductive layer may be disposed (or positioned) on the peripheral outer regions (or edges) of the bottom surfaces of the N-type and P-type layers 216 and 218 (e.g., as shown with the conductive traces 332 and 336 of FIG. 3C). For some embodiments, the N-type and P-type layers 216 and 218 may be directly disposed on the conductive traces 236 and 232, respectively, where the N-type layer 216 may be substantially positioned (or located) adjacent to the P-type layer 218. In these embodiments, the dielectric layers 229 may be disposed between a plurality of small gaps that slightly separate the N-type layer 216 from the P-type layer 218. Furthermore, in some embodiments, the N-type layer 216 may have a thickness (or z-height) that is substantially equal to a thickness of the P-type layer 218. Whereas, in other embodiments, the N-type layer 216 may have a thickness that is different than a thickness of the P-type layer 218. In one embodiment, the N-type layer 216 may have a top surface that is substantially coplanar to a top surface of the P-type layer 218.

As such, in these embodiments, the conductive traces 234 may be disposed directly on the top surfaces of the N-type and P-type layers 216 and 218, where the conductive traces 234 may be directly positioned above/over a portion of the top surface of the N-type layer 216 and a portion of the top surface of the P-type layer 218. For these embodiments, the conductive traces 234 may be implemented as a second conductive layer disposed on and coupled to the top surfaces of the N-type and P-type layers 216 and 218. In these embodiments, the conductive traces 234 of the second conductive layer may be disposed (or positioned) on the inner regions (or edges) of the top surfaces of the N-type and P-type layers 216 and 218 (e.g., as shown with the conductive traces 334 of FIG. 3B). Furthermore, in some embodiments, the conductive traces 234 of the second conductive layer may implement a smaller inner ring on the top surfaces of the N-type and P-type layers 216 and 218, and the conductive traces 232 and 236 of the first conductive layer may implement a larger outer ring on the bottom surfaces of the N-type and P-type layers 216 and 218, where the larger outer ring has a diameter that is greater than a diameter of the smaller inner ring (i.e., the diameter of the larger outer ring surrounds the diameter of the smaller inner ring). Additionally, the conductive traces 234 have a width that is less than a width of the conductive traces 232 and 236, according to some embodiments (i.e., the width may be defined as the thickness (in the x-axis as shown in the cross-sectional view of FIG. 2) of the conductive traces 234 of the smaller inner ring that is less than the width defined as the thickness of the conductive traces 232 and 234 of the larger outer ring).

For some embodiments, the TEC 250 may implement the conductive traces 234 of the second conductive layer to receive the localized "Heat in" generated by the die 210 (e.g., the localized "Heat in" may refer to the "Heat in" received from a small region of backside of the die 210), the conductive traces 234 may then direct the localized "Heat in" towards the N-type and P-type layers 216 and 218 and the conductive traces 232 and 236 of the first conductive layer, and lastly the N-type and P-type layers 216 and 218 and the conductive traces 232 and 236 of the first conductive layer may thus direct the dispersed "Heat out" towards the package substrate (or the like) (e.g., the dispersed "Heat out" may refer to the "Heat out" supplied out/over a larger region of the conductive traces 232 and 236 of the TEC 250).

In some embodiments, the N-type and P-type layers 216 and 218 of the TEC 250 may be comprised of one or more thermoelectric materials, including, but are not limited to, bismuth (Bi) and/or tellurium (Te) based alloys (e.g., Bi2Te3, BiSb, or the like), lead telluride (PbTe), silicon-germanium (SiGe), any combinations thereof, and/or any other similar thermoelectric materials. The thermoelectric materials of the N-type and P-type layers 216 and 218 may be doped with one or more dopants, such as phosphorus, arsenic, antimony, bismuth, selenium and tellurium used as N-type dopants, and such as boron, aluminum, gallium and indium used as P-type dopants.

According to some embodiments, the N-type and P-type layers 216 and 218 may be separated with the dielectric layer 229 (e.g., an insulating layer, an oxide layer, or the like) and/or any similar insulating materials/layers known in the art. Furthermore, as shown in FIG. 2, the N-type and P-type layers 216 and 218 are combined to implement the TEC 250, where the N-type and P-type layers 216 and 218 may be conductively (or electrically) coupled in series (or a series configuration) via the conductive traces 232, 234, and 236, and where the N-type and P-type layers 216 and 218 may be thermally coupled in parallel (or a parallel configuration). In some embodiments, the conductive traces 232, 234, and 236 may be comprised of one or more conductive materials, such as copper, aluminum, silver, aluminum/copper alloys, any combination thereof, and/or any suitable conductive material (or the like).

In additional embodiments, a TEC controller 251 may be implemented into the backend layers 230 of the die 210 to control the TEC 250 such as switching the TEC 250 on an on-mode, an off-mode, a steady-state mode, and/or so on. For example, the TEC 250 may be turned on right before a power spike using the TEC controller 251, where the TEC controller 251 of the TEC 250 may thus allow longer turbo power spikes. In other embodiments, the TEC controller 251 may be a circuit (or the like) disposed in the backend layers 230 of the die 210 that may control the TEC 250. For example, the circuit may sense the onset of a workload and thus triggers the turbo mode of the TEC 250 and/or proactively turns "on" the TEC 20—even before the heat burst kicks in. Alternatively, the circuit may read the rise in temperature(s) using a temperature sensor (or the like), which therefore reactively turns "on" the TEC 250 as the heat rises past a predetermined temperature (and, likewise, the circuit may turn "off" the TEC 250 when the temperature drops below another predetermined temperature). For example, the circuit of the TEC controller may proactively turn "on" the TEC when a workload threshold is triggered (or sensed), and/or the circuit of the TEC controller may reactively turn "on" the TEC when a temperature threshold is triggered by a reading of a temperature sensor (or the like). Additionally, since the TEC 250 does not impede the thermal pathway used by the cooling solution of the IHS (e.g., the IHS 120 of FIG. 1), the TEC 250 does not impact the cooling efficiency on top of (or above) the die 210. Note that, in another embodiment, the TEC 250 may be coupled to a heat spreader, such as for example, an IHS, a heat sink, a cold plate, and/or any other heat dissipating component.

Furthermore, in some embodiments, the TEC 250 may be implemented with one or more power generation modes that may help during the steady state operations of the die 210. For example, in such embodiments, the N-type and P-type layers 216 and 218 (or thermoelectric films/materials) of the TEC 250 may convert the thermal gradient between the die 210 and the package substrate (e.g., the package substrate 102 of FIG. 1) into electricity, where the "Current in" may be inputted to the TEC 250 with one or more of the solder balls 243, and the TEC 250 may then output the "Current out" with one or more of the solder balls 243. In additional embodiments, the semiconductor package 200 may implement a copper slug or the like. In this additional embodiment, the copper slug may be disposed (or placed/located) in the package substrate and immediately beneath (or below) the solder balls 243 that are passing current in/out to the thermoelectric elements of the TEC 250. In such embodiments, the copper slug may reduce the temperature of the package substrate and may prevent the diffusion of heat back from the package substrate to the die 210.

Note that the semiconductor package 200 may include fewer or additional packaging components based on the desired packaging design.

FIGS. 3A-3C are illustrations of cross-sectional and perspective views of a TEC 350 with a plurality of N-type layers 316, a plurality of P-type layers 318, a plurality of conductive traces 332, 333, 334 and 336, and a plurality of gaps 353, according to some embodiments. The TEC 350 may be substantially similar to the TECs 150 and 250 described above in FIGS. 1-2. Likewise, the components of the TEC 350 are substantially similar to the components of the TECs 150 and 250 described above in FIGS. 1-2. Accordingly, the N-type layers 316, the P-type layers 318, the conductive traces 332, 333, 334 and 336, and the gaps 353 may be substantially similar to the N-type layers, the P-type layers, the conductive traces, and the gaps described above in FIGS. 1-2.

Note that, in some embodiments, the TEC 350 may be patterned (or shaped) with the illustrated arrangement shown in FIGS. 3A-3C. That is, the illustrated arrangement of the TEC 350 may be a circular shaped TEC (or a round shaped TEC, a disk shaped TEC, or the like) with a plurality of sectors (or sliced regions) comprised of N-type and P-type layers 316 and 318. For example, as shown in FIGS. 3B and 3C, the circular shaped TEC 350 may include eight sectors comprised of alternating N-type and P-type layers 316 and 318, where the eight sectors may have substantially the same area and the same central angle (i.e., an octant central angle) (45°)). While, in other embodiments, the TEC 350 may be patterned with any desired arrangement (or shape) that may be comprised of the N-type and P-type layers 316 and 318, the conductive traces 332, 333, 334, and 336, and so on.

Referring now to FIG. 3A, a cross-sectional illustration of a TEC 350 is shown, in accordance with an embodiment. In some embodiments, the N-type and P-type layers 316 and 318 may be combined to implement the illustrated arrangement of the TEC 350 as shown in FIGS. 3A-3C. As such, in these embodiments, the N-type and P-type layers 316 and 318 may be conductively coupled in series via the conductive traces 332, 333, 334, and 336, and the N-type layers 316 may be thermally coupled in parallel to the P-type layers 318 with the gaps 353 disposed between (or separating) the N-type layers 316 from the P-type layers 318, where the gaps 353 may be filled with the dielectric layers (or the like) that may surround the N-type layers 316, the P-type layers 318, the conductive traces 332, 333, 334 and 336 of the TEC 350 (e.g., as shown with the dielectric layers 229 of FIG. 2).

Furthermore, as shown in FIG. 3A, the conductive traces 334 may be directly disposed on/over the top surfaces of the N-type and P-type layers 316 and 318, where the conductive traces 334 may couple portions of the top surfaces of the N-type layers 316 to portions of the top surfaces of the P-type layers 318. Likewise, the conductive traces 333 may be directly disposed on/over the bottom surfaces of the N-type and P-type layers 316 and 318, where the conductive traces 333 may couple portions of the bottom surfaces of the N-type layers 316 to portions of the bottom surfaces of the P-type layers 318.

Referring now to FIGS. 3B and 3C, perspective illustrations of the TEC 350 is shown, in accordance with an embodiment. In particular, FIGS. 3B and 3C may respectively illustrate a heat conduction path from the "Heat in" in the top view and the "Heat out" in the bottom view. As shown in FIG. 3B, the TEC 350 may implement the conductive traces 334 of the inner ring to receive the "Heat in" from a small region (or a small hot spot) of an electrical component such as an active die, and to direct the "Heat in" towards the N-type and P-type layers 316 and 318 and the conductive traces 333 of the outer ring, where the one or more conductive traces 332 may receive the "Current in", and the one or more conductive traces 336 may supply the "Current out". That is, as shown in FIG. 3C, the TEC 350 may implement the N-type and P-type layers 316 and 318, the conductive traces 333 of the outer ring, and the conductive traces 332 and 336 to subsequently direct/supply the "Heat out" over a larger region towards the package substrate (or the like). Note that, in these embodiments, the conductive traces 334 of the inner ring may have smaller sectors with a central angle that is less than a central angle of the conductive traces 333 of the outer ring with larger sectors.

Note that the TEC 350 of FIGS. 3A-3C may include fewer or additional packaging components based on the desired packaging design.

FIG. 4 is an illustration of a cross-sectional view of a semiconductor packaged system 400 including a die 414, a substrate 412, a package substrate 402, and one or more TECs 450, according to one embodiment. In particular, FIG. 4 illustrates a semiconductor package 400 including a die 414, a substrate 412 (or an interposer), interconnect structures (e.g., the plurality of bumps disposed below the die 414 and the substrate 412), and the package substrate 402, where the die 414, the substrate 412, and/or the package substrate 402 may include the TECs 450, according to some embodiments. In some embodiments, the TECs 450 with the TEC cooling components may be substantially similar to the TECs 150, 250, and 350 with the TEC cooling components described above in FIGS. 1, 2, and 3A-3C. Note that the semiconductor package 400 is not limited to the illustrated semiconductor packaged system, and thus may be designed/formed with fewer, alternate, or additional packaging components and/or with different interconnecting structures.

For one embodiment, the semiconductor package 400 may implement the die 414, the substrate 412, and/or the package substrate 402 to include the TECs 450. For example, in one embodiment, the TECs 450 may be embedded in/on/near the backend layers (or the bottom surfaces, the redistribution layers, etc.) of the die 414, the substrate 412, and/or the package substrate 402. In another embodiment, the TECs 450 may also be disposed adjacent to any of the high-power electronic components of the die 414, the substrate 412, and/or the package substrate 402, such that the TECs 450 may be positioned substantially close to the hot spot(s) of the respective components of the die 414, the substrate 412, and/or the package substrate 402 to reduce the reaction time of the turbo scenarios, to enable the longer power spikes, to direct the heat from a small hot spot region to a larger region that is substantially closed to the small hot spot region, and to maintain a separated heat conduction path aside from the general heat conduction path as a result of the one or more low-k materials implemented with the TEC 450. Note that, even if the TECs described herein are disposed below/near the active die and/or within the backend layers of the active die (e.g., as shown with the TECs 150 and 250 of FIGS. 1-2), the TECs described herein may be implemented with and thermally coupled to any electrical component—and not limited to only active dies, silicon substrates, or the like. That is, the TEC cooling components described herein (e.g., the N-type and P-type layers, the conductive traces and vias, the dielectric layers, the solder balls, the TEC controllers, the copper slugs, and so on as described above in FIGS. 1, 2, and 3A-3C) may be combined to implement the one or more arrangements of the TECs that may be thermally coupled to any electrical component, where, for example, the arrangement(s) of the TECs may be implemented with the one or more power modes, the N-type and P-type layers conductively coupled in series via the conductive traces, and/or the N-type layers thermally coupled to the P-type layers in parallel.

According to one embodiment, the semiconductor package 400 is merely one example of an embodiment of a semiconductor packaged system. For one embodiment, the semiconductor package 400 may include a BGA package, a LGA package, and/or a PGA package. For one embodiment, a die 414 is coupled to a substrate 412 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 414, the substrate 412, and/or the package substrate 402 may be coupled using ACF. For one embodiment, the substrate 412 may be, but is not limited to, a silicon interposer and/or a die with through silicon vias (TSVs). For an alternate embodiment, the semiconductor package 400 may omit the interposer/substrate 412.

For some embodiments, the semiconductor package 400 may have the die 414 disposed on the interposer 412, where both the stacked die 414 and interposer 412 are disposed on a package substrate 402. According to some embodiments, the package substrate 402 may include, but is not limited to, a package, a substrate, a PCB, and a motherboard. For one embodiment, the package substrate 402 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 402 may also include conductive layers comprised of copper lines/traces, pads, vias, planes, and/or holes.

For one embodiment, the die 414 may include, but is not limited to, a semiconductor die, an electronic device (e.g., a wireless device), an IC, a CPU, a microprocessor, a PCH, a memory, and/or a FPGA. The die 414 may be formed from a material such as silicon and have circuitry thereon that is to be coupled to the interposer 412. Although some embodiments are not limited in this regard, the package substrate 402 may in turn be coupled to another body, for example, a computer motherboard. One or more connections between the package substrate 402, the interposer 412, and the die 414—e.g., including some or all of bumps 416, 418, and 420—may include one or more interconnect structures and underfill layers 426 and 428. In some embodiments, these interconnect structures (or connections) may variously comprise an alloy of nickel, palladium, and tin (and, in some embodiments, copper, silver, or the like).

Connections between the package substrate 402 and another body may be made using any suitable structure, such as the illustrative bumps 420 shown. The package substrate 402 may include a variety of electronic structures formed thereon or therein. The interposer 412 may also include electronic structures formed thereon or therein, which may be used to couple the die 414 to the package substrate 402. For one embodiment, one or more different materials may be used for forming the package substrate 402 and the interposer 412. In certain embodiments, the package substrate 402 is an organic substrate made up of one or more layers of polymer base material, with conducting regions for transmitting signals. In certain embodiments, the interposer 412 is made up of a ceramic base material including metal regions for transmitting signals. Although some embodiments are not limited in this regard, the semiconductor package 400 may include gap control structures 430—e.g., positioned between the package substrate 402 and the interposer 412. Such gap control structures 430 may mitigate a change in the height of the gap between the package substrate 402 and the interposer 412, which otherwise might occur during reflowing while die 414 is attached to interposer 412. Note that the semiconductor package 400 includes an underfill material 428 between the interposer 412 and the die 414, and an underflow material 426 between the package substrate 402 and the interposer 412. For one embodiment, the underfill materials (or layers) 426 and 428 may be one or more polymers that are injected between the layers. For other embodiments, the underfill materials may be MUF.

Note that the semiconductor package 400 may include fewer or additional packaging components based on the desired packaging design.

Figure 5:
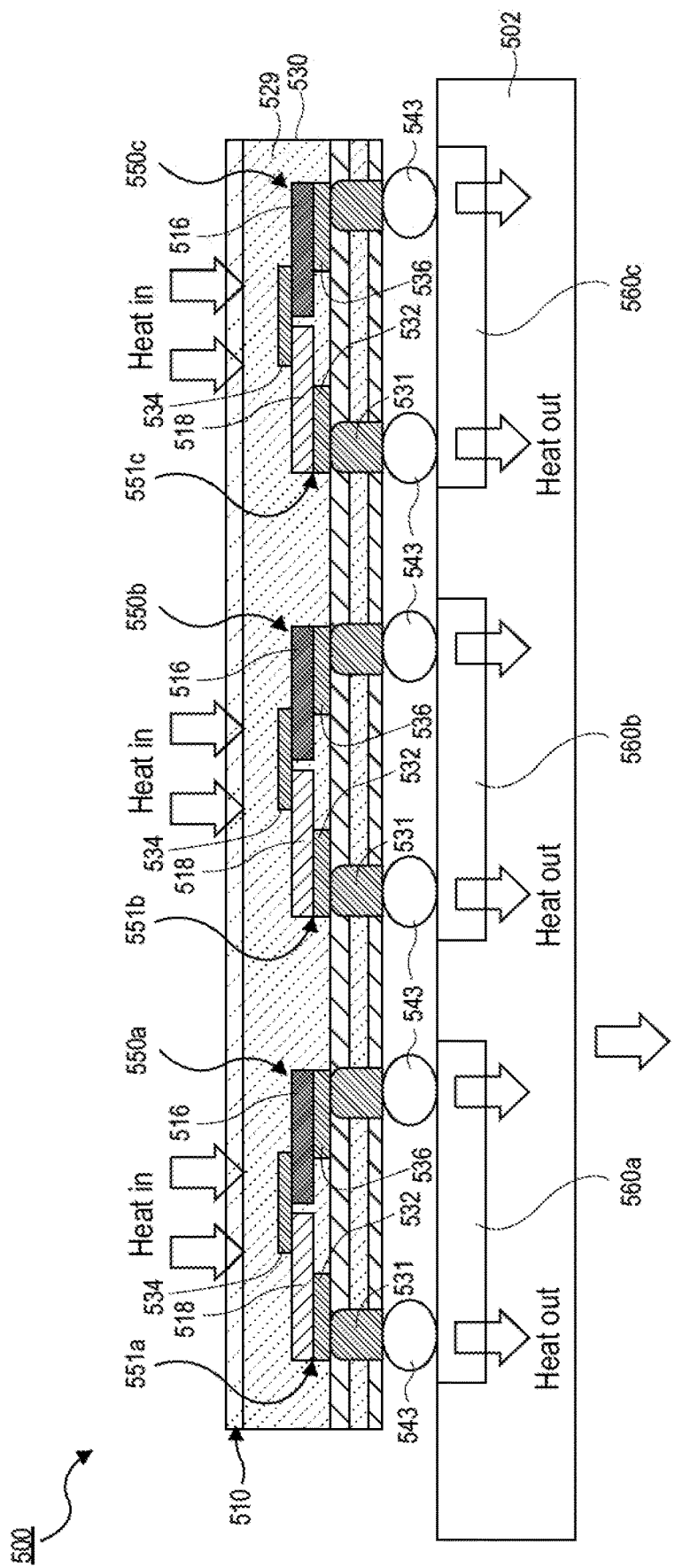
FIG. 5 is an illustration of a cross-sectional view of a portion of a semiconductor package with an active die and a package substrate, where the active die has a plurality of TECs disposed in a plurality of backend layers, and where a plurality of copper slugs are disposed in the package substrate and directly below the plurality of TECs, according to one embodiment.

FIG. 5 is an illustration of a cross-sectional view of a portion of a semiconductor package 500 with a die 510 and a package substrate 502, according to some embodiments. For some embodiments, the die 510 may have a plurality of TECs 550a-c disposed in a plurality of backend layers 530. In these embodiments, a plurality of copper slugs 560a-c may be disposed in the package substrate 502, where the copper slugs 560a-c may be positioned directly below the respective TECs 550a-c. The semiconductor package 500 may be substantially similar to the semiconductor package 200 described above in FIG. 2, with the exception that multiple TECs 550a-c are disposed within the backend layers 530, and that the copper slugs 560a-c of the package substrate 502 are thermally coupled to the respective TECs 560a-c.

Likewise, the components of the die 510 with the TECs 550a-c, the TEC controllers 551a-c, the backend layers 530, and the solder balls 543 are substantially similar to the components of the die 210 with the TEC 250, the TEC controller 251, the backend layers 230, and the solder balls 243 described above in FIG. 2. Accordingly, the N-type layers 516, the P-type layers 518, the conductive traces 532, 533, 534 and 536, and the gaps 553 may be substantially similar to the N-type layers, the P-type layers, the conductive traces, and the gaps described above in FIGS. 1-2.

Note that the semiconductor package 500 may include fewer or additional packaging components based on the desired packaging design.

Figure 6:
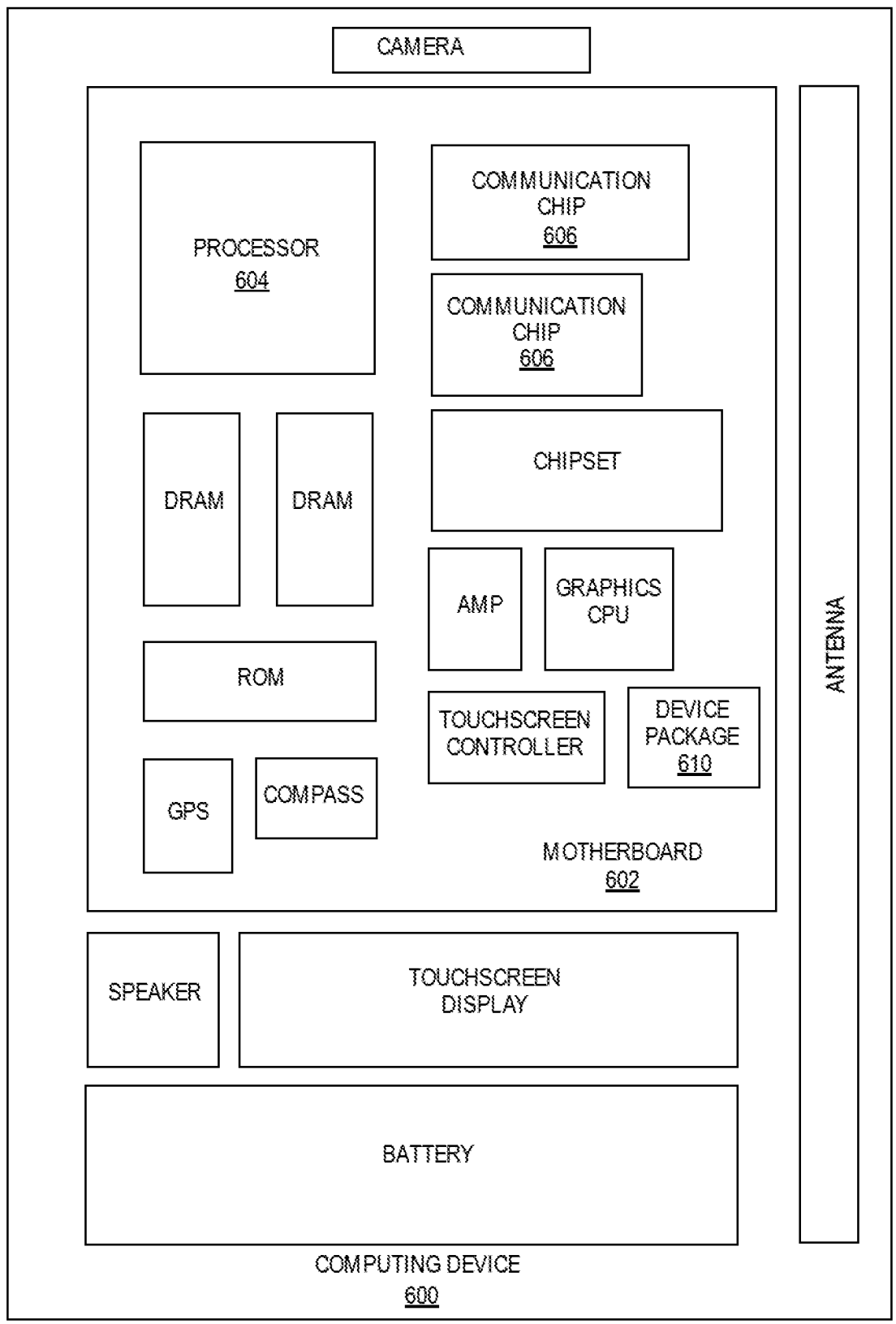
FIG. 6 is an illustration of a schematic block diagram illustrating a computer system that utilizes an IHS, a TIM, a plurality of dies with a plurality of TECs and a plurality of backend layers, and a package substrate, according to one embodiment.

FIG. 6 is an illustration of a schematic block diagram illustrating a computer system 600 that utilizes a device package 610 (or a semiconductor package) with an IHS, a TIM, a die(s), a TEC, and a package substrate, according to one embodiment. FIG. 6 illustrates an example of computing device 600. Computing device 600 houses a motherboard 602. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be a semiconductor package as described herein. Device package 610 may include, but is not limited to, a substrate, a package substrate, and/or a PCB. In one embodiment, device package 610 may be substantially similar to the semiconductor packages 100, 200, and 500 of FIGS. 1-2 and 5 described herein. Device package 610 may include the TECs with the arrangements of the TEC cooling components as described herein (e.g., as illustrated and described above with the TECs 150, 250, 350, 450, and 550a-c of FIGS. 1, 2, 3A-3C, 4, and 5)—or any other components from the figures described herein.

Note that device package 610 may be a single component/device, a subset of components, and/or an entire system, as the materials, features, and components may be limited to device package 610 and/or any other component of the computing device 600 that may need the TECs with the arrangements of the TEC cooling components as described herein (e.g., the motherboard 602, the processor 604, and/or any other component of the computing device 600 that may need the embodiments of the TECs with the arrangements of the TEC cooling components and/or the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip 606 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a die with a plurality of backend layers on a package substrate, wherein the plurality of backend layers couple the die to the package substrate; and a TEC in the plurality of backend layers of the die, wherein the TEC includes a plurality of N-type layers, a plurality of P-type layers, a first conductive layer, and a second conductive layer, wherein the first conductive layer is directly coupled to outer regions of bottom surfaces of the plurality of N-type and P-type layers, wherein the second conductive layer is directly coupled to inner regions of top surfaces of the plurality of N-type and P-type layers, and wherein the first conductive layer has a width that is greater than a width of the second conductive layer.

In example 2, the subject matter of example 1 can optionally include that the second conductive layer is above the first conductive layer, wherein the plurality of N-type layers are adjacent to the plurality of P-type layers, wherein the plurality of N-type and P-type layers are directly disposed between the first and second conductive layers, and wherein the TEC is a circular shaped TEC.

In example 3, the subject matter of examples 1-2 can optionally include that the circular shaped TEC includes a plurality of sectors, wherein the plurality of sectors of the circular shaped TEC are comprised of the plurality of N-type and P-type layers, wherein the second conductive layer of the circular shaped TEC is comprised of an inner conductive ring, and wherein the inner conductive ring is directly on the inner regions of the top surfaces of the plurality of N-type and P-type layers.

In example 4, the subject matter of examples 1-3 can optionally include that the first conductive layer of the circular shaped TEC is comprised of an outer conductive ring, and wherein the outer conductive ring is directly on the outer regions of the bottom surfaces of the plurality of N-type and P-type layers.

In example 5, the subject matter of examples 1-4 can optionally include that the outer conductive ring has a diameter that is greater than a diameter of the inner conductive ring, and wherein the diameter of the inner conductive ring is positioned directly over and within the diameter of the outer conductive ring.

In example 6, the subject matter of examples 1-5 can optionally include a TIM on the die; an IHS over the TIM, the die, and the package substrate, wherein the IHS includes a lid and a plurality of legs, and wherein the TIM is directly between the lid of the IHS and the die; a sealant on a top surface of the package substrate, wherein the sealant couples the legs of the IHS to the top surface of the package substrate; a plurality of vias in the plurality of backend layers, wherein the plurality of vias are directly coupled to the first conductive layer of the TEC; a plurality of dielectric layers in the plurality of backend layers, wherein the plurality of dielectric layers surround the plurality of N-type and P-type layers and the first and second conductive layers of the TEC, wherein the plurality of N-type layers are separated from the plurality of P-type layers with a plurality of gaps, and wherein the plurality of gaps are filled with the plurality of dielectric layers; and a plurality of solder balls couple the plurality of backend layers of the die to the package substrate, wherein the plurality of vias couple two or more of the plurality of solder balls to the first conductive layer of the TEC.

In example 7, the subject matter of examples 1-6 can optionally include a TEC controller coupled to the TEC, wherein the TEC controller has a plurality of power modes to control the TEC, and wherein the TEC controller proactively turns "on" the TEC when a workload threshold is triggered, or the TEC controller reactively turns "on" the TEC when a temperature threshold is triggered with a temperature sensor.

In example 8, the subject matter of examples 1-7 can optionally include a conductive slug in the package substrate, wherein the conductive slug of the package substrate is below the two or more of the plurality of solder balls that are coupled to the first conductive layer of the TEC.

In example 9, the subject matter of examples 1-8 can optionally include that the plurality of N-type layers of the TEC are conductively coupled to the plurality of P-type layers of the TEC in a series configuration via the first and second conductive layers, and wherein the plurality of N-type layers of the TEC are thermally coupled to the plurality of P-type layers of the TEC in a parallel configuration.

Example 10 is a method to form a semiconductor package, comprising: disposing a die with a plurality of backend layers on a package substrate, wherein the plurality of backend layers couple the die to the package substrate; and disposing a thermoelectric cooler (TEC) in the plurality of backend layers of the die, wherein the TEC includes a plurality of N-type layers, a plurality of P-type layers, a first conductive layer, and a second conductive layer, wherein the first conductive layer is directly coupled to outer regions of bottom surfaces of the plurality of N-type and P-type layers, wherein the second conductive layer is directly coupled to inner regions of top surfaces of the plurality of N-type and P-type layers, and wherein the first conductive layer has a width that is greater than a width of the second conductive layer.

In example 11, the subject matter of example 10 can optionally include that the second conductive layer is above the first conductive layer, wherein the plurality of N-type layers are adjacent to the plurality of P-type layers, wherein the plurality of N-type and P-type layers are directly disposed between the first and second conductive layers, and wherein the TEC is a circular shaped TEC.

In example 12, the subject matter of examples 10-11 can optionally include that the circular shaped TEC includes a plurality of sectors, wherein the plurality of sectors of the circular shaped TEC are comprised of the plurality of N-type and P-type layers, wherein the second conductive layer of the circular shaped TEC is comprised of an inner conductive ring, and wherein the inner conductive ring is directly on the inner regions of the top surfaces of the plurality of N-type and P-type layers.

In example 13, the subject matter of examples 10-12 can optionally include that the first conductive layer of the circular shaped TEC is comprised of an outer conductive ring, and wherein the outer conductive ring is directly on the outer regions of the bottom surfaces of the plurality of N-type and P-type layers.

In example 14, the subject matter of examples 10-13 can optionally include that the outer conductive ring has a diameter that is greater than a diameter of the inner conductive ring, and wherein the diameter of the inner conductive ring is positioned directly over and within the diameter of the outer conductive ring.

In example 15, the subject matter of examples 10-14 can optionally include that disposing a TIM on the die; disposing an IHS over the TIM, the die, and the package substrate, wherein the IHS includes a lid and a plurality of legs, wherein the TIM is directly between the lid of the IHS and the die, and wherein a sealant couples the legs of the IHS to the top surface of the package substrate; and coupling the plurality of backend layers of the die to the package substrate with a plurality of solder balls, wherein the plurality of backend layers include a plurality of vias and a plurality of dielectric layers, wherein the plurality of vias couple two or more of the plurality of solder balls to the first conductive layer of the TEC, wherein the plurality of vias are directly coupled to the first conductive layer of the TEC, wherein the plurality of dielectric layers surround the plurality of N-type and P-type layers and the first and second conductive layers of the TEC, wherein the plurality of N-type layers are separated from the plurality of P-type layers with a plurality of gaps, and wherein the plurality of gaps are filled with the plurality of dielectric layers.

In example 16, the subject matter of examples 10-15 can optionally include disposing a TEC controller coupled to the TEC, wherein the TEC controller has a plurality of power modes to control the TEC, and wherein the TEC controller proactively turns "on" the TEC when a workload threshold is triggered, or the TEC controller reactively turns "on" the TEC when a temperature threshold is triggered with a temperature sensor.

In example 17, the subject matter of examples 10-16 can optionally include disposing a conductive slug in the package substrate, wherein the conductive slug of the package substrate is below the two or more of the plurality of solder balls that are coupled to the first conductive layer of the TEC.

In example 18, the subject matter of examples 10-17 can optionally include that the plurality of N-type layers of the TEC are conductively coupled to the plurality of P-type layers of the TEC in a series configuration via the first and second conductive layers, and wherein the plurality of N-type layers of the TEC are thermally coupled to the plurality of P-type layers of the TEC in a parallel configuration.

Example 19 is a semiconductor packaged system, comprising: a substrate on a package substrate; a die with a plurality of backend layers on a substrate, wherein the plurality of backend layers couple the die to the substrate, and wherein the plurality of backend layers include a plurality of vias and a plurality of dielectric layers; a plurality of TECs in the plurality of backend layers of the die, wherein each of the plurality of TECs includes a plurality of N-type layers, a plurality of P-type layers, a first conductive layer, and a second conductive layer, wherein the first conductive layer is directly coupled to outer regions of bottom surfaces of the plurality of N-type and P-type layers, wherein the second conductive layer is directly coupled to inner regions of top surfaces of the plurality of N-type and P-type layers, and wherein the first conductive layer has a width that is greater than a width of the second conductive layer; a plurality of solder balls couple the plurality of backend layers of the die to the substrate, wherein the plurality of vias couple two or more of the plurality of solder balls to the first conductive layer of the plurality of TECs; a plurality of conductive slugs in the substrate, wherein the plurality of conductive slugs of the substrate are respectively below the plurality of TECs, and wherein the plurality of solder balls thermally couple the plurality of conductive slugs to the plurality of TECs; a TIM on the die; and an IHS over the TIM, the die, the substrate, and the package substrate.

In example 20, the subject matter of example 19 can optionally include that one or more first TECs are thermally coupled to the substrate or the package substrate, wherein the second conductive layer is above the first conductive layer, wherein the plurality of N-type layers are adjacent to the plurality of P-type layers, wherein the plurality of N-type and P-type layers are directly disposed between the first and second conductive layers, wherein the plurality of TECs are a plurality of circular shaped TECs, wherein the plurality of N-type layers of the plurality of TECs are conductively coupled to the plurality of P-type layers of the plurality of TECs in a series configuration via the first and second conductive layers, and wherein the plurality of N-type layers of the plurality of TECs are thermally coupled to the plurality of P-type layers of the plurality of TECs in a parallel configuration.

In example 21, the subject matter of examples 19-20 can optionally include the plurality of circular shaped TECs include a plurality of sectors, wherein the plurality of sectors of the plurality of circular shaped TECs are comprised of the plurality of N-type and P-type layers, wherein the second conductive layer of the plurality of circular shaped TECs are comprised of an inner conductive ring, and wherein the inner conductive ring is directly on the inner regions of the top surfaces of the plurality of N-type and P-type layers.

In example 22, the subject matter of examples 19-21 can optionally include that the first conductive layer of the plurality of circular shaped TECs are comprised of an outer conductive ring, and wherein the outer conductive ring is directly on the outer regions of the bottom surfaces of the plurality of N-type and P-type layers.

In example 23, the subject matter of examples 19-22 can optionally include that the outer conductive ring has a diameter that is greater than a diameter of the inner conductive ring, and wherein the diameter of the inner conductive ring is positioned directly over and within the diameter of the outer conductive ring.

In example 24, the subject matter of examples 19-23 can optionally include that the IHS includes a lid and a plurality of legs, wherein the TIM is directly between the lid of the IHS and the die, wherein a sealant couples the legs of the IHS to the top surface of the package substrate, wherein the plurality of vias are directly coupled to the first conductive layer of the plurality of TECs, wherein the plurality of dielectric layers surround the plurality of N-type and P-type layers and the first and second conductive layers of the plurality of TECs, wherein the plurality of N-type layers are separated from the plurality of P-type layers with a plurality of gaps, and wherein the plurality of gaps are filled with the plurality of dielectric layers.

In example 25, the subject matter of examples 19-24 can optionally include that a plurality of TEC controllers coupled to the plurality of TECs, wherein the plurality of TEC controllers has a plurality of power modes to control the plurality of TECs, and wherein the plurality of TEC controllers proactively turn "on" the TEC when a workload threshold is triggered, or the plurality of TEC controllers reactively turn "on" the plurality of TECs when a temperature threshold is triggered with a temperature sensor.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a die with a plurality of backend layers on a package substrate, wherein the plurality of backend layers couple the die to the package substrate; and
   a thermoelectric cooler (TEC) in the plurality of backend layers of the die, wherein the TEC includes a plurality of N-type layers, a plurality of P-type layers, a first conductive layer, and a second conductive layer, wherein the first conductive layer is directly coupled to outer regions of bottom surfaces of the plurality of N-type and P-type layers, wherein the second conductive layer is directly coupled to inner regions of top surfaces of the plurality of N-type and P-type layers, and wherein the first conductive layer has a width that is greater than a width of the second conductive layer.

2. The semiconductor package of claim 1, wherein the second conductive layer is above the first conductive layer, wherein the plurality of N-type layers are adjacent to the plurality of P-type layers, wherein the plurality of N-type and P-type layers are directly disposed between the first and second conductive layers, and wherein the TEC is a circular shaped TEC.

3. The semiconductor package of claim 2, wherein the circular shaped TEC includes a plurality of sectors, wherein the plurality of sectors of the circular shaped TEC are comprised of the plurality of N-type and P-type layers, wherein the second conductive layer of the circular shaped TEC is comprised of an inner conductive ring, and wherein the inner conductive ring is directly on the inner regions of the top surfaces of the plurality of N-type and P-type layers.

4. The semiconductor package of claim 3, wherein the first conductive layer of the circular shaped TEC is comprised of an outer conductive ring, and wherein the outer conductive ring is directly on the outer regions of the bottom surfaces of the plurality of N-type and P-type layers.

5. The semiconductor package of claim 4, wherein the outer conductive ring has a diameter that is greater than a diameter of the inner conductive ring, and wherein the diameter of the inner conductive ring is positioned directly over and within the diameter of the outer conductive ring.

6. The semiconductor package of claim 1, further comprising:
   a thermal interface material (TIM) on the die;
   an integrated heat spreader (IHS) over the TIM, the die, and the package substrate, wherein the IHS includes a lid and a plurality of legs, and wherein the TIM is directly between the lid of the IHS and the die;
   a sealant on a top surface of the package substrate, wherein the sealant couples the legs of the IHS to the top surface of the package substrate;
   a plurality of vias in the plurality of backend layers, wherein the plurality of vias are directly coupled to the first conductive layer of the TEC;
   a plurality of dielectric layers in the plurality of backend layers, wherein the plurality of dielectric layers surround the plurality of N-type and P-type layers and the first and second conductive layers of the TEC, wherein the plurality of N-type layers are separated from the plurality of P-type layers with a plurality of gaps, and wherein the plurality of gaps are filled with the plurality of dielectric layers; and
   a plurality of solder balls couple the plurality of backend layers of the die to the package substrate, wherein the plurality of vias couple two or more of the plurality of solder balls to the first conductive layer of the TEC.

7. The semiconductor package of claim 6, further comprising a conductive slug in the package substrate, wherein the conductive slug of the package substrate is below the two or more of the plurality of solder balls that are coupled to the first conductive layer of the TEC.

8. The semiconductor package of claim 1, further comprising a TEC controller coupled to the TEC, wherein the TEC controller has a plurality of power modes to control the TEC, and wherein the TEC controller proactively turns "on" the TEC when a workload threshold is triggered, or the TEC controller reactively turns "on" the TEC when a temperature threshold is triggered with a temperature sensor.

9. The semiconductor package of claim 1, wherein the plurality of N-type layers of the TEC are conductively coupled to the plurality of P-type layers of the TEC in a series configuration via the first and second conductive layers, and wherein the plurality of N-type layers of the TEC are thermally coupled to the plurality of P-type layers of the TEC in a parallel configuration.

10. A semiconductor packaged system, comprising:
    a substrate on a package substrate;
    a die with a plurality of backend layers on the substrate, wherein the plurality of backend layers couple the die to the substrate, and wherein the plurality of backend layers include a plurality of vias and a plurality of dielectric layers;
    a plurality of thermoelectric coolers (TECs) in the plurality of backend layers of the die, wherein each of the plurality of TECs includes a plurality of N-type layers, a plurality of P-type layers, a first conductive layer, and a second conductive layer, wherein the first conductive layer is directly coupled to outer regions of bottom surfaces of the plurality of N-type and P-type layers, wherein the second conductive layer is directly coupled to inner regions of top surfaces of the plurality of N-type and P-type layers, and wherein the first conductive layer has a width that is greater than a width of the second conductive layer;
    a plurality of solder balls couple the plurality of backend layers of the die to the substrate, wherein the plurality of vias couple two or more of the plurality of solder balls to the first conductive layer of the plurality of TECs;
    a plurality of conductive slugs in the substrate, wherein the plurality of conductive slugs of the substrate are respectively below the plurality of TECs, and wherein the plurality of solder balls thermally couple the plurality of conductive slugs to the plurality of TECs;
    a thermal interface material (TIM) on the die; and
    an integrated heat spreader (IHS) over the TIM, the die, the substrate, and the package substrate.

11. The semiconductor packaged system of claim 10, wherein one or more first TECs are thermally coupled to the substrate or the package substrate, wherein the second conductive layer is above the first conductive layer, wherein the plurality of N-type layers are adjacent to the plurality of P-type layers, wherein the plurality of N-type and P-type layers are directly disposed between the first and second conductive layers, wherein the plurality of TECs are a plurality of circular shaped TECs, wherein the plurality of N-type layers of the plurality of TECs are conductively coupled to the plurality of P-type layers of the plurality of TECs in a series configuration via the first and second conductive layers, and wherein the plurality of N-type layers of the plurality of TECs are thermally coupled to the plurality of P-type layers of the plurality of TECs in a parallel configuration.

12. The semiconductor packaged system of claim 11, wherein the plurality of circular shaped TECs include a plurality of sectors, wherein the plurality of sectors of the plurality of circular shaped TECs are comprised of the plurality of N-type and P-type layers, wherein the second conductive layer of the plurality of circular shaped TECs are comprised of an inner conductive ring, and wherein the inner conductive ring is directly on the inner regions of the top surfaces of the plurality of N-type and P-type layers.

13. The semiconductor packaged system of claim 12, wherein the first conductive layer of the plurality of circular shaped TECs are comprised of an outer conductive ring, and wherein the outer conductive ring is directly on the outer regions of the bottom surfaces of the plurality of N-type and P-type layers.

14. The semiconductor packaged system of claim 13, wherein the outer conductive ring has a diameter that is greater than a diameter of the inner conductive ring, and wherein the diameter of the inner conductive ring is positioned directly over and within the diameter of the outer conductive ring.

15. The semiconductor packaged system of claim 10, wherein the IHS includes a lid and a plurality of legs, wherein the TIM is directly between the lid of the IHS and the die, wherein a sealant couples the legs of the IHS to the top surface of the package substrate, wherein the plurality of vias are directly coupled to the first conductive layer of the plurality of TECs, wherein the plurality of dielectric layers surround the plurality of N-type and P-type layers and the first and second conductive layers of the plurality of TECs, wherein the plurality of N-type layers are separated from the plurality of P-type layers with a plurality of gaps, and wherein the plurality of gaps are filled with the plurality of dielectric layers.

16. The semiconductor packaged system of claim 10, further comprising a plurality of TEC controllers coupled to the plurality of TECs, wherein the plurality of TEC controllers has a plurality of power modes to control the plurality of TECs, and wherein the plurality of TEC controllers proactively turn "on" the plurality of TECs when a workload threshold is triggered, or the plurality of TEC controllers reactively turn "on" the TECs when a temperature threshold is triggered with a temperature sensor.

* * * * *